US011923377B2

(12) United States Patent
Cha et al.

(10) Patent No.: US 11,923,377 B2
(45) Date of Patent: Mar. 5, 2024

(54) DISPLAY DEVICE AND TILED DISPLAY DEVICE INCLUDING THE SAME

(71) Applicant: Samsung Display Co., LTD., Yongin-si (KR)

(72) Inventors: Na Hyeon Cha, Yongin-si (KR); Sun Kwun Son, Suwon-si (KR); Dong Hee Shin, Asan-si (KR); Dong Hyeon Ki, Asan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/563,661

(22) Filed: Dec. 28, 2021

(65) Prior Publication Data

US 2022/0310662 A1    Sep. 29, 2022

(30) Foreign Application Priority Data

Mar. 23, 2021 (KR) .......................... 10-2021-0037454

(51) Int. Cl.
G09G 3/32        (2016.01)
H01L 27/12       (2006.01)
H01L 25/065      (2023.01)

(52) U.S. Cl.
CPC ............. *H01L 27/124* (2013.01); *G09G 3/32* (2013.01); *G09G 2300/026* (2013.01);
(Continued)

(58) Field of Classification Search
CPC ......... G09G 2300/0426; G09G 3/3266; G09G 2310/0286; G09G 2310/0232; G09G 3/3208; G09G 3/2074; G09G 3/3674; G09G 3/32; G09G 2300/026; G09G 2310/0267; G09G 2310/08; G09G 3/3677; G09G 2310/0281; G09G 2330/12; G09G 2310/0264; G09G 2310/0278; G09G 2320/0223; G09G 3/32253; G09G 2300/023; G09G 3/20; G09G 3/3225;
(Continued)

(56) References Cited

U.S. PATENT DOCUMENTS 10,032,839 B2 *   7/2018  Kang ................... H01L 27/3276
10,163,383 B2 *  12/2018  Lee ....................... G09G 3/3674
(Continued)

FOREIGN PATENT DOCUMENTS

CN       103714785  A  *  4/2014    ........... G09G 3/3655
CN       103943076  B  *  9/2018    ........... G09G 3/3677
(Continued)

*Primary Examiner* — Ricardo Osorio
(74) *Attorney, Agent, or Firm* — KILE PARK REED & HOUTTEMAN PLLC

(57) ABSTRACT

A display device includes a display area including pixels, a non-display area adjacent to the display area, and a display driver electrically connected to the non-display area. The display area includes a data line that supplies a data voltage received from the display driver to the pixel, the data line extending in a first direction, a gate input line electrically connected to the display driver and extending in the first direction, a gate driver electrically connected to the gate input line, and a gate line electrically connected to the gate driver and extending in a second direction intersecting the first direction.

24 Claims, 10 Drawing Sheets

(52) U.S. Cl.
CPC . *G09G 2310/0267* (2013.01); *G09G 2310/08* (2013.01); *H01L 25/0655* (2013.01); *H01L 27/1255* (2013.01)

(58) Field of Classification Search
CPC ........... G02F 1/136286; G02F 1/13336; H01L 29/78645; H01L 27/124; H01L 25/0655; H01L 27/1255; H01L 27/3276; H01L 27/329; H01L 25/167; G06F 3/1446; G09F 9/30; H10K 59/131; H10K 59/18
See application file for complete search history.

(56) References Cited

U.S. PATENT DOCUMENTS

| | | | |
|---|---|---|---|
| 2007/0035485 A1* | 2/2007 | Yoon | G09G 3/3208 345/76 |
| 2007/0195053 A1* | 8/2007 | Tobita | G09G 3/3677 345/100 |
| 2013/0321499 A1* | 12/2013 | Park | G09G 3/3275 345/698 |
| 2016/0189598 A1* | 6/2016 | Takeuchi | G09G 3/3677 345/95 |
| 2016/0267831 A1* | 9/2016 | Seo | G09G 3/2085 |
| 2016/0370635 A1* | 12/2016 | Tanaka | G02F 1/1368 |
| 2017/0288008 A1* | 10/2017 | Kim | G09G 3/3258 |
| 2017/0316730 A1* | 11/2017 | Cheng | G09G 3/2092 |
| 2018/0068629 A1* | 3/2018 | Shin | G02F 1/13454 |
| 2022/0199031 A1* | 6/2022 | Jo | H10K 59/88 |

FOREIGN PATENT DOCUMENTS

| | | |
|---|---|---|
| KR | 10-2013-0018493 | 2/2013 |
| KR | 10-2016-0015479 | 2/2016 |
| KR | 10-2016-0110840 | 9/2016 |
| KR | 10-2132864 | 7/2020 |

* cited by examiner

DISPLAY DEVICE AND TILED DISPLAY DEVICE INCLUDING THE SAME

CROSS-REFERENCE TO RELATED APPLICATION(S)

This application claims priority to and benefits of Korean Patent Application No. 10-2021-0037454 under 35 U.S.C. § 119 filed on Mar. 23, 2021, in the Korean Intellectual Property Office, the entire contents of which are incorporated herein by reference.

BACKGROUND

1. Technical Field

The disclosure relates to a display device and a tiled display device including the same.

2. Description of the Related Art

As the information-oriented society continues to advance, more and more demands are placed on display devices for displaying images in various ways. For example, display devices are employed in various electronic devices such as smartphones, digital cameras, laptop computers, navigation devices, and smart televisions. The display device may be a flat panel display device such as a liquid crystal display device, a field emission display device and an organic light emitting display device. Among the flat panel display devices, in the light emitting display device, since each of pixels of a display panel may include a light emitting element capable of emitting light by itself, an image can be displayed without a backlight unit providing light to the display panel.

In case that the display device is manufactured in a large size, a defect rate of the light emitting element may increase due to an increase in the number of pixels, thereby deteriorating productivity or reliability of the display device. To solve this problem, in a tiled display device, a large-sized screen may be implemented by connecting display devices having a relatively small size. The tiled display device may include a boundary portion called a seam between the display devices, due to a non-display area or a bezel area of each of the display devices adjacent to each other. In case that a single image is displayed on the entire screen, the boundary portion between the display devices gives a sense of disconnection over the entire screen, thereby reducing a sense of immersion in the image.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure also provide a tiled display device capable of removing a sense of disconnection between display devices and improving a sense of immersion in an image, by preventing the recognition of boundary portions or non-display areas between the display devices.

However, aspects of the disclosure are not restricted to the ones set forth herein. The above and other aspects of the disclosure will become more apparent to one of ordinary skill in the art to which the disclosure pertains by referencing the detailed description of the disclosure given below.

According to an embodiment, a display device may include a display area including pixels; a non-display area adjacent to the display area; and a display driver electrically connected to the non-display area. The display area comprises a data line that supplies a data voltage received from the display driver to the pixel, the data line extending in a first direction; a gate input line electrically connected to the display driver and extending in the first direction; a gate driver electrically connected to the gate input line; and a gate line electrically connected to the gate driver and extending in a second direction intersecting the first direction.

The display area may comprise pixel areas including the pixels. At least one of the pixel areas may comprise a pixel circuit area including a pixel circuit of the pixel; and a pixel peripheral area including the gate driver, the pixel peripheral area surrounding the pixel circuit area.

The pixel areas may be disposed in rows and columns. The gate driver may be disposed across the pixel peripheral area of the pixel areas in a row.

The gate driver may comprise a first gate transistor that supplies a scan clock signal to an output terminal of a gate signal based on a voltage of a first node; a second gate transistor that discharges an output terminal of the gate signal based on a scan clock bar signal that is a reverse signal of the scan clock signal; and a first gate capacitor electrically connected between a gate electrode and a source electrode of the first gate transistor.

Each of the first gate transistor, the second gate transistor, and the first gate capacitor may be disposed on at least one of an upper side, a lower side, a left side, or a right side of the pixel peripheral area.

The gate driver may comprise first gate drivers disposed in a first column; second gate drivers disposed in a second column; third gate drivers disposed in a third column; and fourth gate drivers disposed in a fourth column.

The first gate drivers may receive a same gate input signal and may supply a gate signal to different gate lines.

The gate input line may comprise a scan clock signal input line that inputs a scan clock signal to the gate driver; a scan clock bar signal input line that inputs a reverse signal of the scan clock signal to the gate driver; and a carry clock signal input line that inputs a carry clock signal to the gate driver.

Each of the scan clock signal input line, the scan clock bar signal input line, and the carry clock signal input line may be disposed between data lines.

The display device may comprise a driving voltage line that supplies a driving voltage to the pixel, the driving voltage line extending in the first direction; and a low potential line that supplies a low potential voltage to the pixel, the low potential line extending in the first direction.

The non-display area may comprise a pad part electrically connected to the display driver; and fan-out lines disposed between the pad part and the display area. The fan-out lines may include bent portions.

Each of the fan-out lines may have a same length.

Each of the driving voltage line and the low potential line may include a plate electrode overlapping the fan-out lines in a thickness direction.

Each of the scan clock signal input line, the scan clock bar signal input line, and the carry clock signal input line may be disposed between the driving voltage line and the low potential line.

The driving voltage line, the gate input line, and the low potential line may be disposed between data lines.

According to an embodiment, a tiled display device may include display devices, each including a display area including pixels; a non-display area adjacent to the display area; and a display driver electrically connected to the non-display area. The display area of each of the display devices may comprise a data line that supplies a data voltage received from the display driver to the pixels, the data line extending in a first direction; a gate input line electrically connected to the display driver and extending in the first direction; a gate driver electrically connected to the gate input line; and a gate line electrically connected to the gate driver and extending in a second direction intersecting the first direction.

The tiled display device may further comprise a coupling area disposed between the display devices. The display driver may be disposed on a side of the non-display area adjacent to the coupling area, or in the non-display area disposed on an opposite side of the coupling area with respect to the display area.

The display area may comprise pixel areas including the pixels. At least one of the pixel areas may comprise a pixel circuit area including a pixel circuit; and a pixel peripheral area including the gate driver, the pixel peripheral area surrounding the pixel circuit area.

The pixel areas may be disposed in rows and columns. The gate driver may be disposed across the pixel peripheral areas of the pixel areas in one row.

The gate driver may comprise a first gate transistor that supplies a scan clock signal to an output terminal of a gate signal based on a voltage of a first node; a second gate transistor that discharges an output terminal of the gate signal based on a scan clock bar signal that is a reverse signal of the scan clock signal; and a first gate capacitor electrically connected between a gate electrode and a source electrode of the first gate transistor. Each of the first gate transistor, the second gate transistor, and the first gate capacitor may be disposed on at least one of an upper side, a lower side, a left side, or a right side of the pixel peripheral area.

In the display device and the tiled display device including the same, the size of a non-display area may be minimized by including a gate driver and a gate input line disposed in a display area. The tiled display device may include display devices in which the size of the non-display area is minimized, so that a coupling area between the display devices may be small enough not to be recognized by a user. Accordingly, in the tiled display device, the coupling area between the display devices may be prevented from being recognized by the user, thereby reducing a sense of disconnection between the display devices and improving a sense of immersion in an image.

However, the effects of the disclosure are not limited to the aforementioned effects, and various other effects are included in the specification.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
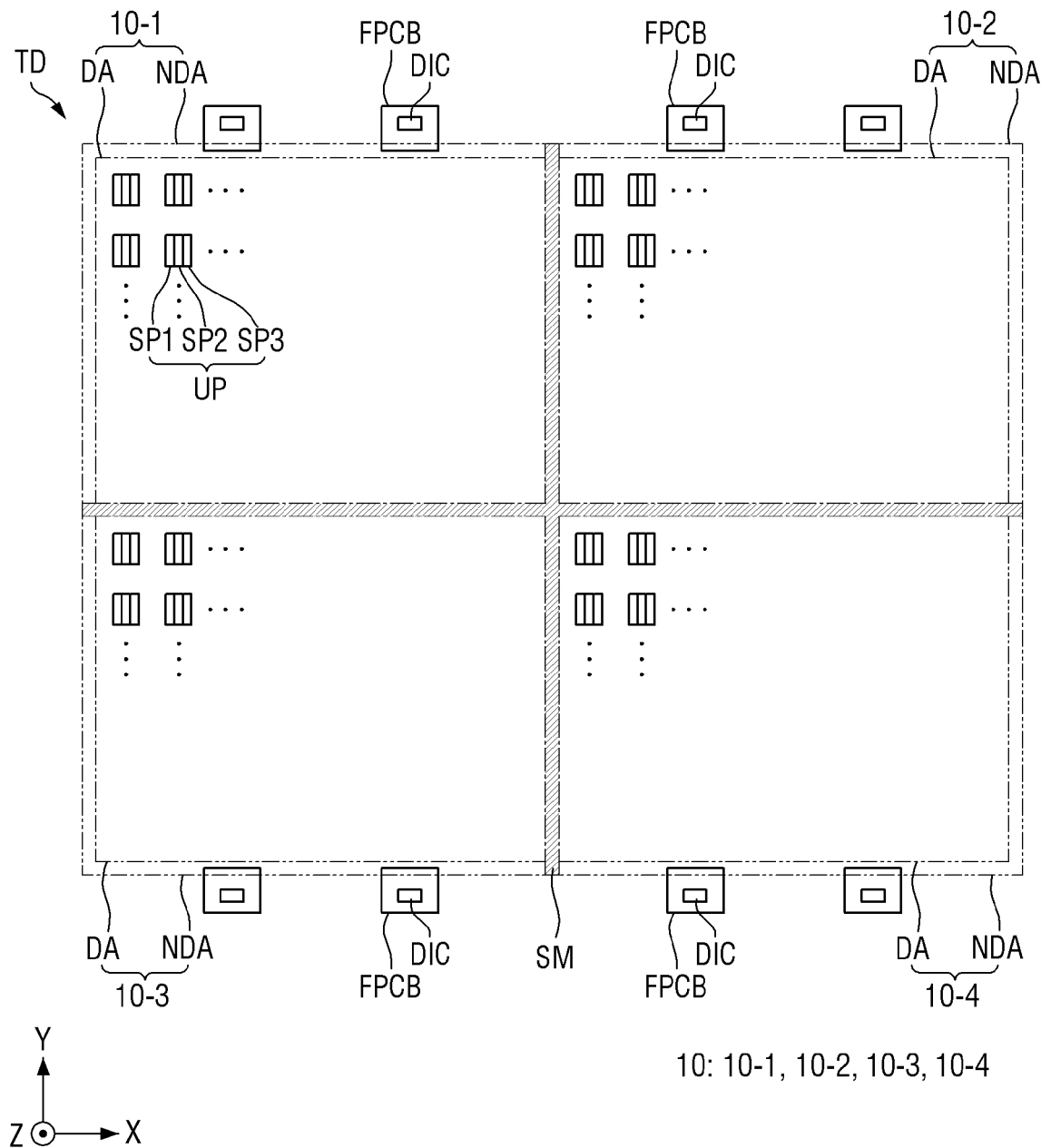
FIG. 1 is a schematic plan view illustrating a tiled display device according to an embodiment.

In the following description, for the purposes of explanation, numerous details are set forth in order to provide a thorough understanding of various embodiments or implementations of the disclosure. As used herein "embodiments" and "implementations" are interchangeable words that are non-limiting examples of devices or methods employing one or more of the implementations or embodiments disclosed herein. It is apparent, however, that various embodiments may be practiced without these details or with one or more equivalent arrangements. In other instances, structures and devices may be shown in block diagram form in order to avoid unnecessarily obscuring various embodiments. Further, various embodiments may be different, but do not have to be exclusive. For example, shapes, configurations, and characteristics of an embodiment may be used or implemented in another embodiment without departing from the scope of the disclosure.

Unless otherwise specified, the illustrated embodiments are to be understood as providing features of varying detail of some or a number of ways in which the disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be substantially perpendicular to one another, or may represent different directions that may not be perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (for example, as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (for example, rotated 90 degrees or about 90 degrees or at other orientations), and, as such, the spatially relative descriptors used herein interpreted accordingly.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terminology used herein is for the purpose of describing embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," "has," and/or "having," and/or variations thereof when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

For example, "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Some or a number of embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (for example, microcode) to perform various functions discussed herein and may optionally be driven by firmware and/or software. It is also contemplated that each block, unit, and/or module may be implemented by dedicated hardware, or as a combination of dedicated hardware to perform some or a number of functions and a processor (for example, one or more programmed microprocessors and associated circuitry) to perform other functions. Also, each block, unit, and/or module of some or a number of embodiments may be physically separated into two or more interacting and discrete blocks, units, and/or modules without departing from the scope of the disclosure. Further, the blocks, units, and/or modules of some or a number of embodiments may be physically combined into more complex blocks, units, and/or modules without departing from the scope of the disclosure.

Unless otherwise defined, all terms (including technical and scientific terms) used herein have the same meaning as commonly understood by one of ordinary skill in the art to which this disclosure pertains. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a schematic plan view illustrating a tiled display device according to an embodiment.

Referring to FIG. 1, a tiled display device TD may include display devices 10. The display devices 10 may be arranged or disposed in a grid form, but are not limited thereto. The display devices 10 may be connected in a first direction (X-axis direction) or a second direction (Y-axis direction), and the tiled display device TD may have a given shape. For example, the display devices 10 may have the same size, but are not limited thereto. For another example, the display devices 10 may have different sizes.

Each of the display devices 10 may have a rectangular shape or a substantially rectangular shape including long sides and short sides. The display devices 10 may be arranged or disposed such that the long sides or the short sides thereof are connected to each other. Some of the display devices 10 may be disposed at the edge of the tiled display device TD to form one side or a side of the tiled display device TD. Some others of the display devices 10 may be disposed at corners of the tiled display device TD to form two adjacent sides of the tiled display device TD. Yet some others of the display devices 10 may be disposed on the inner side of the tiled display device TD, and may be surrounded by other display devices 10.

The display device 10 may include a display area DA and a non-display area NDA. The display area DA may include pixels to display an image. The non-display area NDA may be disposed around the display area DA to surround or to be adjacent to the display area DA, and may not display an image.

The tiled display device TD may have a planar shape or a substantially planar shape as a whole, but is not limited thereto. The tiled display device TD may have a three-dimensional shape to provide a three-dimensional effect to a user. For example, in case that the tiled display device TD has a three-dimensional shape, at least some of the display devices 10 may have a curved shape or a substantially curved shape. For another example, the display devices 10 may each have a planar shape or a substantially planar shape and may be connected to each other at an angle, so that the tiled display device TD may have a three-dimensional shape.

The tiled display device TD may include a coupling or connecting area SM disposed between display areas DA. The tiled display device TD may be formed by connecting non-display areas NDA of the adjacent display devices 10. The display devices 10 may be connected to each other through a bonding member or an adhesive member disposed in the coupling area SM. The coupling area SM of each of the display devices 10 may not include a pad unit and a flexible film attached to the pad unit. Accordingly, the distance between the display areas DA of the display devices 10 may be small enough that the coupling area SM between the display devices 10 is not recognized by the user. The reflectance of external light of the display areas DA of the display devices 10 may be substantially the same as that of the coupling area SM between the display devices 10. Accordingly, in the tiled display device TD, the coupling area SM between the display devices 10 may be prevented from being recognized by the user, thereby reducing a sense of disconnection between the display devices 10 and improving a sense of immersion in an image.

The display device 10 may include pixels or unit pixels UP arranged or disposed along or in rows and columns in the display area DA. The unit pixels UP may include first to third pixels SP1, SP2, and SP3, and each of the first to third pixels SP1, SP2, and SP3 may emit light having a peak wavelength. The first pixel SP1 may emit light of a first color, the second pixel SP2 may emit light of a second color, and the third pixel SP3 may emit light of a third color. For example, the first color light may be red light having a peak wavelength in a range of about 610 nm to about 650 nm, the second color light may be green light having a peak wavelength in a range of about 510 nm to about 550 nm, and the third color light may be blue light having a peak wavelength in a range of about 440 nm to about 480 nm, but the disclosure is not limited thereto. The first to third pixels SP1, SP2, and SP3 may be sequentially and repeatedly arranged or disposed along or in the first direction (X-axis direction) in the display area DA, but are not limited thereto.

The tiled display device TD may include first to fourth display devices 10-1, 10-2, 10-3, and 10-4. The number and connection relationship of the display devices 10 are not limited to the embodiment of FIG. 1. The number of the display devices 10 may be determined according to the size of each of the display devices 10 and the tiled display device TD. Each of the first to fourth display devices 10-1, 10-2, 10-3, and 10-4 may include a flexible film FPCB and a display driver DIC.

The flexible film FPCB may be disposed on the non-display area NDA provided on one side or a side of the tiled display device TD. The flexible film FPCB may be disposed on one side or a side of the non-display area NDA adjacent to the coupling area SM. The flexible film FPCB may be disposed on the non-display area NDA disposed on the opposite side of the coupling area SM with respect to the display area DA. For example, the flexible film FPCB may be disposed on the non-display area NDA on the upper side of the first display device 10-1 and the non-display area NDA on the upper side of the second display device 10-2. The flexible film FPCB may be disposed on the non-display area NDA on the lower side of the third display device 10-3 and the non-display area NDA on the lower side of the fourth display device 10-4. One side or a side of the flexible film FPCB may be connected to the pad unit on the substrate, and the other side or another side of the flexible film FPCB may be connected to a source circuit board (not shown). The flexible film FPCB may transmit a source voltage or data voltage of a display driver DIC to the display device 10.

The display driver DIC may be disposed on the flexible film FPCB, and may be connected to the first to third pixels SP1, SP2, and SP3 of the display device 10. For example, the display driver DIC may be an integrated circuit (IC). The display driver DIC may convert digital video data into an analog data voltage based on a source control signal of a timing controller (not shown), and supply the data voltage to a data line of the display area DA through the flexible film FPCB.

Optionally, the flexible film FPCB may be additionally disposed on the non-display area NDA on the left side of the first and third display devices 10-1 and 10-3, and may be additionally disposed on the non-display area NDA on the right side of the second and fourth display devices 10-2 and 10-4, but is not limited thereto.

Figure 2:
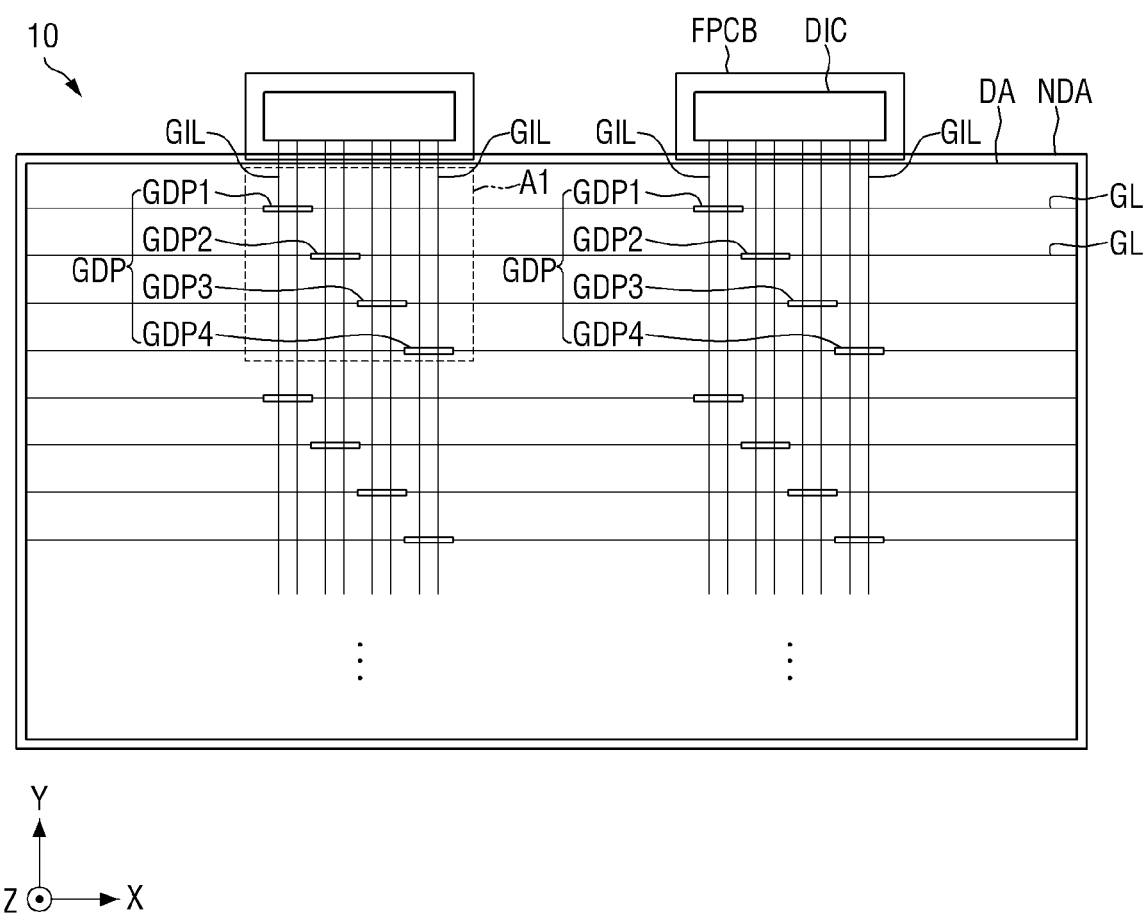
FIG. 2 is a schematic plan view illustrating a display device according to an embodiment.
Figure 3:
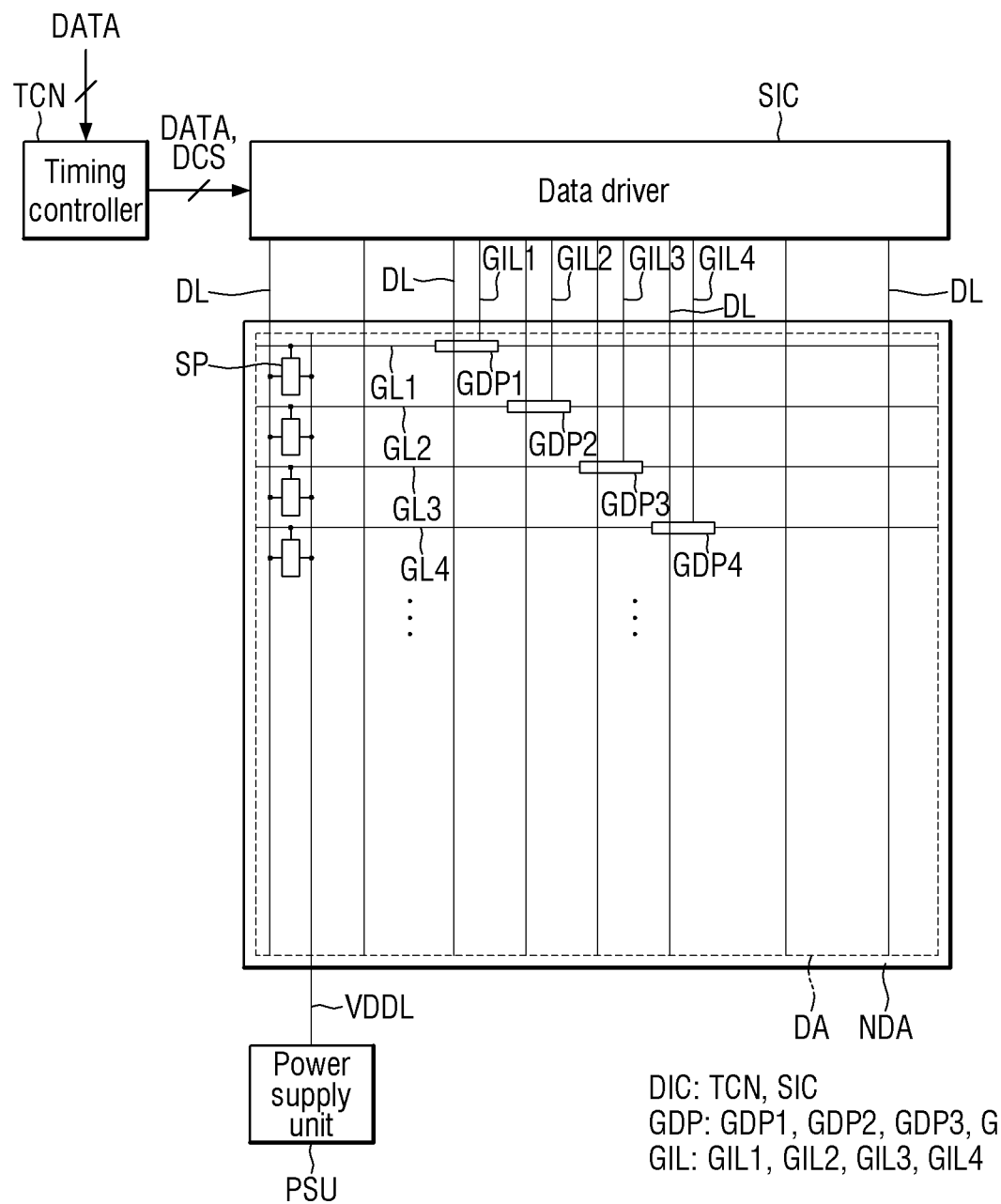
FIG. 3 is a block diagram illustrating a display device according to an embodiment.
Figure 4:
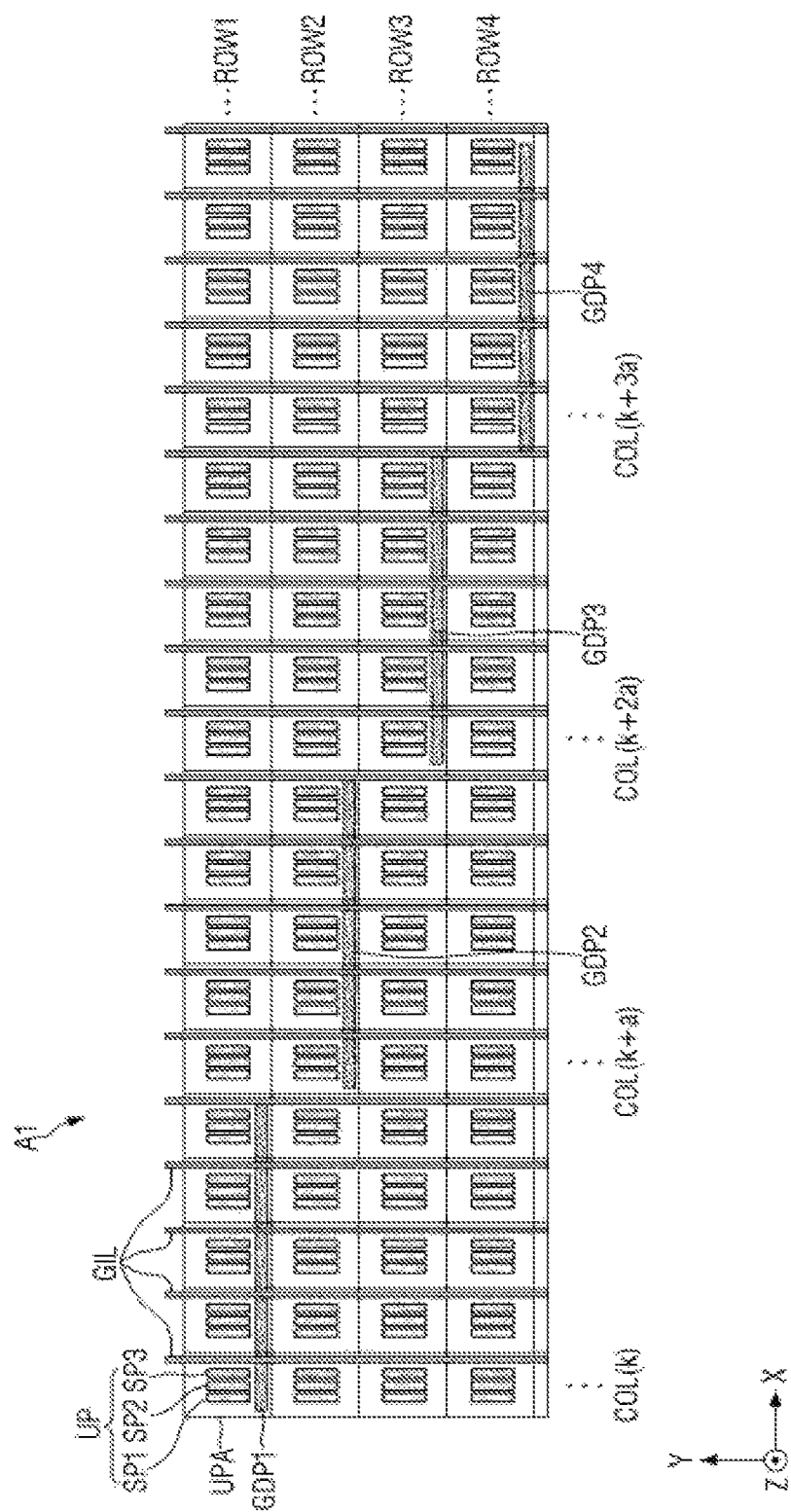
FIG. 4 is an enlarged view of area A1 of FIG. 2.

FIG. 2 is a schematic plan view illustrating a display device according to an embodiment. FIG. 3 is a block diagram illustrating a display device according to an embodiment. FIG. 4 is an enlarged view of area A1 of FIG. 2.

Referring to FIGS. 2 to 4, the display device 10 may include the display area DA and the non-display area NDA.

The display area DA may include pixels SP, data lines DL, driving voltage lines VDDL, gate lines GL, a gate driver GDP, and a gate input line GIL. Here, each of the pixels SP may be one of the first to third pixels SP1, SP2, and SP3.

Each of the pixels SP may be connected to the data line DL, the driving voltage line VDDL, and the gate line GL. Each of the pixels SP may include a pixel circuit and a light emitting element. The pixel circuit may supply a driving current proportional to the data voltage of the data line DL to the light emitting element, and the light emitting element may emit light having a luminance determined based on the magnitude of the driving current.

The data lines DL may extend in the second direction (Y-axis direction) and may be spaced apart from each other in the first direction (X-axis direction). The data lines DL may be connected between a data driver SIC and the pixel SP. The data lines DL may supply the data voltage to the pixels SP. The data voltage may determine the luminance of each of the pixels SP.

The driving voltage lines VDDL may extend in the second direction (Y-axis direction) and may be spaced apart from each other in the first direction (X-axis direction). The driving voltage lines VDDL may be connected between a power supply unit PSU and the pixel SP. The driving voltage lines VDDL may supply a driving voltage to the pixels SP. The driving voltage may be a high potential voltage for driving the light emitting elements of the pixels SP.

The gate lines GL may extend in the first direction (X-axis direction) and may be spaced apart from each other in the second direction (Y-axis direction) intersecting the first direction (X-axis direction). Each of the gate lines GL may be connected to at least one gate driver GDP disposed in the display area DA. The gate lines GL may include first to fourth gate lines GL1, GL2, GL3, and GL4. The first to fourth gate lines GL1, GL2, GL3, and GL4 may be connected to first to fourth gate drivers GDP1, GDP2, GDP3, and GDP4, respectively. For example, one first gate line GL1 may be connected to two first gate drivers GDP1, but is not limited thereto. The first to fourth gate lines GL1, GL2, GL3, and GL4 may sequentially supply a gate signal generated by a 4-phase driving method to the pixels SP.

The gate driver GDP may be disposed in the display area DA to supply the gate signal to the gate line GL. The gate driver GDP may be disposed in each of rows in which the pixels SP are arranged or disposed. At least one gate driver GDP may be disposed in the same row. For example, in case that the display device 10 may include two display drivers DIC, the two gate drivers GDP may be disposed in the same row. Each of the gate drivers GDP may be disposed across pixel areas or unit pixel areas UPA in one row. The gate driver GDP may be disposed in a region of the unit pixel area UPA where the pixel circuit of the pixel SP is not disposed. For example, in case that the pixel circuit of the pixel SP is disposed in a pixel circuit area disposed in the center of the unit pixel area UPA, the gate driver GDP may be disposed in a pixel peripheral area surrounding the pixel circuit area of the unit pixel area UPA. Each of the gate drivers GDP may include gate transistors and gate capacitors, and thus may be disposed across several or tens of unit pixel areas UPA. Accordingly, the gate driver GDP may be disposed across several or tens of unit pixel areas UPA, depending on its size.

The gate driver GDP may include first gate drivers GDP1, second gate drivers GDP2, third gate drivers GDP3, and fourth gate drivers GDP4. The first to fourth gate drivers GDP1, GDP2, GDP3, and GDP4 may be driven by a 4-phase driving method, but are not limited thereto. The first to fourth gate drivers GDP1, GDP2, GDP3, and GDP4 may be disposed in different columns. The first to fourth gate drivers GDP1, GDP2, GDP3, and GDP4 may be sequentially arranged or disposed along or in rows. The first gate drivers GDP1 may be disposed in the same column to receive the same gate input signal. The second gate drivers GDP2 may be disposed in the same column to receive the same gate input signal. Accordingly, each of the first gate drivers GDP1 and the second gate drivers GDP2 may receive the same gate input signal, thereby minimizing the number of gate input lines GIL.

For example, the first gate driver GDP1 may be disposed in columns including a $k^{th}$ column COL(k) (k being a positive integer) in a first row ROW1. The second gate driver GDP2 may be disposed in columns including a $(k+a)^{th}$ column COL(k+a) (a being a positive integer) in a second row ROW2. The third gate driver GDP3 may be disposed in columns including a $(k+2a)^{th}$ column COL(k+2a) in a third row ROW3. The fourth gate driver GDP4 may be disposed in columns including a $(k+3a)^{th}$ column COL(k+3a) in a fourth row ROW4. The first to fourth gate drivers GDP1, GDP2, GDP3, and GDP4 may be sequentially arranged or disposed from a fifth row. The first gate driver GDP1 may supply a gate signal to the first gate line GL1, the second gate driver GDP2 may supply a gate signal to the second gate line GL2, the third gate driver GDP3 may supply a gate signal to the third gate line GL3, and the fourth gate driver GDP4 may supply a gate signal to the fourth gate line GL4.

The first to fourth gate drivers GDP1, GDP2, GDP3, and GDP4 may receive a gate input signal from the data driver SIC through the gate input line GIL. Each of the first to fourth gate drivers GDP1, GDP2, GDP3, and GDP4 may be connected to gate input lines GIL. The first to fourth gate drivers GDP1, GDP2, GDP3, and GDP4 may generate the gate signal supplied to the first to fourth gate lines GL1, GL2, GL3, and GL4 based on the gate input signal.

The gate input lines GIL may extend in the second direction (Y-axis direction) and may be spaced apart from each other in the first direction (X-axis direction). The gate input lines GIL may be connected between the data driver SIC and the gate driver GDP. Each of the gate input lines GIL may supply the gate input signal to the gate drivers GDP. The gate input lines GIL may include first to fourth gate input lines GIL1, GIL2, GIL3, and GIL4. For example, the first gate input lines GIL1 may be connected to the first gate drivers GDP1 disposed in the $k^{th}$ column COL(k). The second gate input lines GIL2 may be connected to the second gate drivers GDP2 disposed in the $(k+a)^{th}$ column COL(k+a). The third gate input lines GIL3 may be connected to the third gate drivers GDP3 disposed in the $(k+2a)^{th}$ column COL(k+2a). The fourth gate input lines GIL4 may be connected to the fourth gate drivers GDP4 disposed in the $(k+3a)^{th}$ column COL(k+3a). Accordingly, the gate input lines GIL may be disposed in some columns of the display area DA, and one gate input line GIL may be connected to the gate drivers GDP disposed in the same column, so that the display device 10 may generate gate signals using a smaller number of gate input lines GIL than the gate lines GL. The gate input lines GIL may be disposed between the data lines DL, but are not limited thereto.

Accordingly, the display device 10 may minimize the size of the non-display area NDA by including the gate input line GIL and the gate driver GDP disposed in the display area DA. The display device 10 may further minimize the size of the non-display area NDA compared to a case where the gate driver is disposed in the non-display area NDA and a case where the gate driver is disposed on a separate flexible film. The tiled display device TD may include the display devices 10 in which the size of the non-display area NDA is minimized, so that the coupling area SM between the display devices 10 may be small enough not to be recognized by the user. In the tiled display device TD, the coupling area SM between the display devices 10 may be prevented from being recognized by the user, thereby reducing a sense of disconnection between the display devices 10 and improving a sense of immersion in an image.

The non-display area NDA may surround or may be adjacent to the display area DA. The non-display area NDA may include fan-out lines and a pad unit. The fan-out lines may connect the data driver SIC to the data lines DL and the gate input lines GIL. The pad unit may be connected to the flexible film FPCB.

The flexible film FPCB may be disposed in the non-display area NDA. One side or a side of the flexible film FPCB may be connected to the pad unit on the substrate, and the other side or another side of the flexible film FPCB may be connected to a source circuit board (not shown). The flexible film FPCB may supply a source voltage or a data voltage of the data driver SIC to the data line DL.

The display driver DIC may include a timing controller TCN and the data driver SIC.

The timing controller TCN may receive digital video data DATA and timing signals from the flexible film FPCB. The timing controller TCN may generate a data control signal DCS based on the timing signals to control an operation timing of the data driver SIC. The timing controller TCN may output the digital video data DATA and the data control signal DCS to the data driver SIC.

The data driver SIC may convert the digital video data DATA into analog data voltages and supply them to the data lines DL through the fan-out lines. The data driver SIC may generate a gate input signal based on the data control signal DCS and may supply the gate input signal to the gate input line GIL.

The power supply unit PSU may be disposed on the flexible film FPCB or the source circuit board to supply a power voltage to the display area DA. The power supply unit PSU may generate a driving voltage and supply it to the driving voltage line VDDL, generate a low potential voltage and supply it to a low potential line, and generate a reference voltage and supply it to a reference voltage line. For example, the driving voltage may be a high potential voltage for driving the light emitting element.

Figure 5:
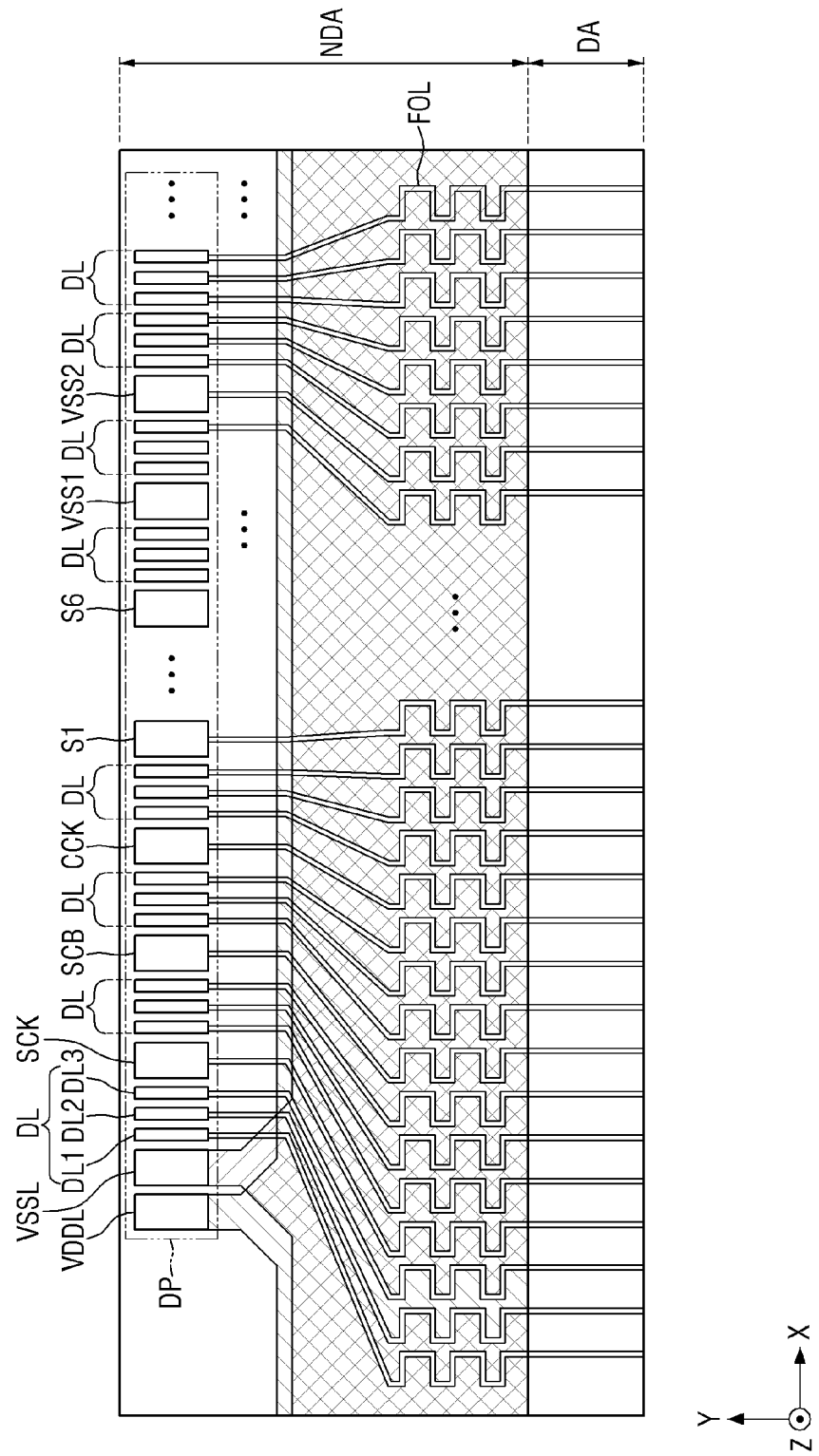
FIG. 5 is a schematic plan view illustrating a pad unit of a display device according to an embodiment.
Figure 6:
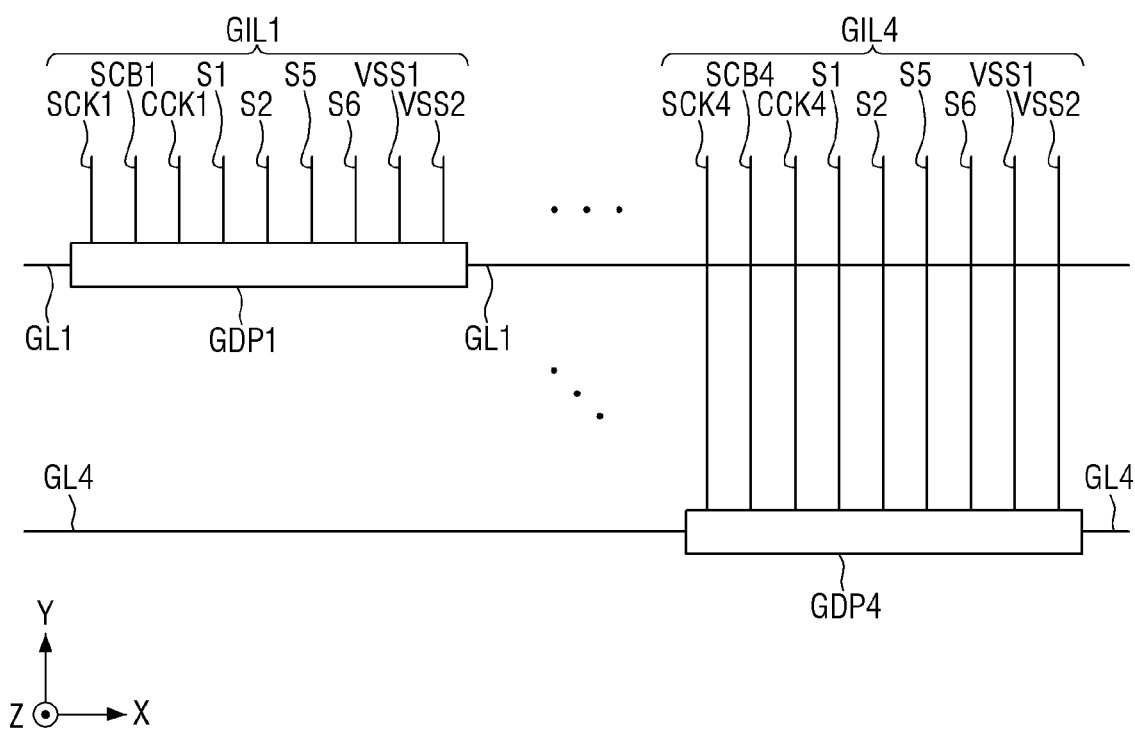
FIG. 6 is a schematic diagram illustrating a gate driver and a gate input line in a display device according to an embodiment.

FIG. 5 is a schematic plan view illustrating a pad unit of a display device according to an embodiment. FIG. 6 is a schematic diagram illustrating a gate driver and a gate input line in a display device according to an embodiment.

Referring to FIGS. 5 and 6, the flexible film FPCB may be connected to a pad unit or pad part DP on the substrate. Fan-out lines FOL may be connected between the pad unit DP and the display area DA. For example, each of the fan-out lines FOL may be connected between the data line DL and the pad unit DP, may be connected between the gate input line GIL and the pad unit DP, and may be connected between the driving voltage line VDDL and the pad unit DP.

The data lines DL may include first to third data lines DL1, DL2, and DL3. The first data line DL1 may supply a data voltage to the first pixel SP1, the second data line DL2 may supply a data voltage to the second pixel SP2, and the third data line DL3 may supply a data voltage to the third pixel SP3. The first to third data lines DL1, DL2, and DL3 corresponding to one unit pixel UP may be disposed adjacent to each other, but are not limited thereto.

The gate input lines GIL may extend in the second direction (Y-axis direction) and may be spaced apart from each other in the first direction (X-axis direction). The gate input lines GIL may be connected between the data driver SIC and the gate driver GDP. The gate input line GIL may supply the gate input signal to the gate drivers GDP. The gate input lines GIL may supply a scan clock signal SCK, a scan clock bar signal SCB, a carry clock signal CCK, a first input signal S1, a second input signal S2, a fifth input signal S5, a sixth input signal S6, a first low potential voltage VSS1, and a second low potential voltage VSS2 to the gate driver GDP. For example, the first gate input line GIL1 may supply a first scan clock signal SCK1, a first scan clock bar signal SCB1, a first carry clock signal CCK1, the first input signal S1, the second input signal S2, the fifth input signal S5, the sixth input signal S6, the first low potential voltage VSS1, and the second low potential voltage VSS2 to the first gate driver GDP1. The fourth gate input line GIL4 may supply a fourth scan clock signal SCK4, a fourth scan clock bar signal SCB4, a fourth carry clock signal CCK4, the first input signal S1, the second input signal S2, the fifth input signal S5, the sixth input signal S6, the first low potential voltage VSS1, and the second low potential voltage VSS2 to the fourth gate driver GDP4. The second and third gate input lines GIL2 and GIL3 may supply gate signals to the second and third gate drivers GDP2 and GDP3, respectively, in the same manner as the first and second gate input lines GIL1 and GIL2.

The gate input lines GIL may be disposed between the data lines DL. The gate input lines GIL may be alternately disposed with the data lines DL. For example, the input line of the scan clock signal SCK may be disposed between the data lines DL. The input line of the scan clock bar signal SCB may be disposed between the data lines DL, and may be spaced apart from the input line of the scan clock signal SCK with the data lines DL interposed therebetween. The input line of the first input signal S1 may be disposed between the data lines DL, and may be spaced apart from the input line of the scan clock bar signal SCB with the data lines DL interposed therebetween.

The fan-out lines FOL may include bent portions and have the same length, and thus may have the same line resistance. For example, a linear distance between the outer edge of the pad unit DP and the data line DL corresponding thereto may be greater than a linear distance between the center of the pad unit DP and the data line DL corresponding thereto. Accordingly, the size or number of the bent portions of the fan-out line FOL that connects the outer edge of the pad unit DP to the data line DL corresponding thereto may be smaller than the size or number of the bent portions of the fan-out line FOL that connects the center of the pad unit DP to the data line DL corresponding thereto.

The driving voltage line VDDL and a low potential line VSSL may be connected to one side or a side of the pad unit DP. Each of the driving voltage line VDDL and the low potential line VSSL may include a plate electrode that overlaps the fan-out line FOL in a thickness direction, thereby canceling signal interference between the gate input line GIL and the data line DL and relieving a coupling capacitance between the gate input line GIL and the data line DL. The driving voltage line VDDL, the low potential line VSSL, and the fan-out line FOL may be disposed on different layers.

Figure 7:
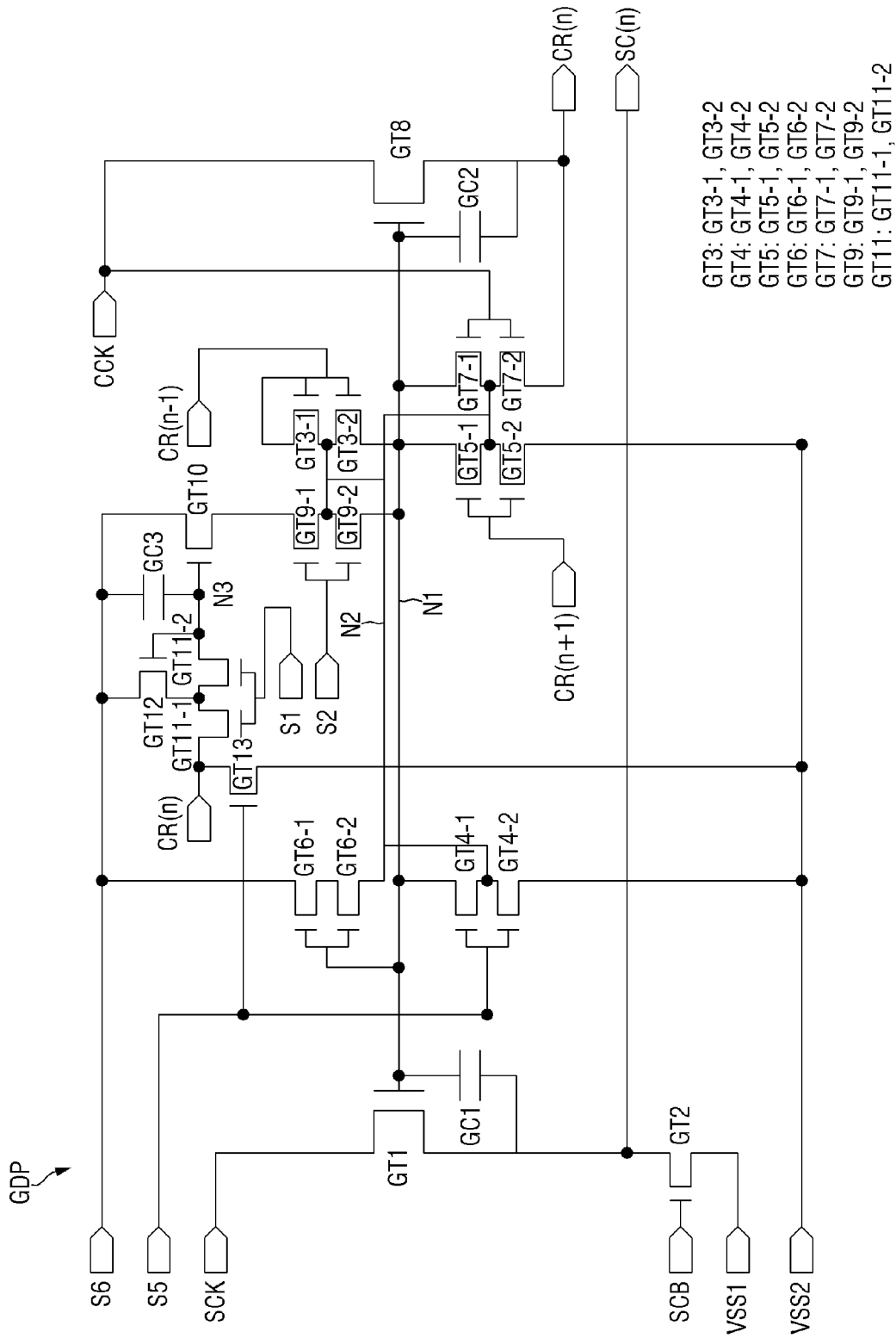
FIG. 7 is a schematic diagram of an equivalent circuit illustrating a gate driver of a display device according to an embodiment.

FIG. 7 is schematic diagram of an equivalent circuit illustrating a gate driver of a display device according to an embodiment.

Referring to FIG. 7, the gate driver GDP may receive gate input signals and output a gate signal SC(n). For example, the gate driver GDP may receive the scan clock signal SCK, the scan clock bar signal SCB, the carry clock signal CCK, the first input signal S1, the second input signal S2, the fifth input signal S5, the sixth input signal S6, the first low potential voltage VS S1, and the second low potential voltage VS S2, but the number and types of the gate input signals are not limited thereto.

The gate driver GDP may include gate transistors and gate capacitors. The gate driver GDP may include first to thirteenth gate transistors GT1 to GT13 and first to third gate capacitors GC1 to GC3.

The first gate transistor GT1 may be turned on based on the voltage of a first node N1 to supply the scan clock signal SCK to the output terminal of the gate signal SC(n). For example, the first gate transistor GT1 may be a pull-up transistor of the gate driver GDP, but is not limited thereto. The output terminal of the gate signal SC(n) may be connected to the gate line GL. The gate electrode of the first gate transistor GT1 may be connected to the first node N1, the drain electrode of the first gate transistor GT1 may be connected to the input terminal of the scan clock signal SCK, and the source electrode of the first gate transistor GT1 may be connected to the output terminal of the gate signal SC(n). Accordingly, the first gate transistor GT1 may be turned on based on the voltage of the first node N1, thereby supplying the gate signal SC(n) to the gate line GL.

The first gate capacitor GC1 may be connected between the first node N1 and the output terminal of the gate signal SC(n). The first gate capacitor GC1 may be connected between the gate electrode of the first gate transistor GT1 and the source electrode of the first gate transistor GT1. Accordingly, the first gate capacitor GC1 may maintain a potential difference between the gate electrode and the source electrode of the first gate transistor GT1.

The second gate transistor GT2 may be turned on based on the scan clock bar signal SCB to discharge the output terminal of the gate signal SC(n). For example, the second gate transistor GT2 may be a pull-down transistor of the gate driver GDP, but is not limited thereto. The gate electrode of the second gate transistor GT2 may be connected to the input terminal of the scan clock bar signal SCB, the drain electrode of the second gate transistor GT2 may be connected to the output terminal of the gate signal SC(n), and the source electrode of the second gate transistor GT2 may be connected to the input terminal of the first low potential voltage VSS1. Accordingly, the second gate transistor GT2 may be turned on based on the scan clock bar signal SCB, thereby initializing the output terminal of the gate signal SC(n) to the first low potential voltage VSS1.

The third gate transistor GT3 may be turned on based on a $(n-1)^{th}$ carry signal CR(n-1) to supply the $(n-1)^{th}$ carry signal CR(n-1) to the first node N1. The third gate transistor GT3 may be a dual transistor including a third-first gate transistor GT3-1 and a third-second gate transistor GT3-2. The gate electrode of the third-first gate transistor GT3-1 may be connected to the input terminal of the $(n-1)^{th}$ carry signal CR(n-1), the drain electrode of the third-first gate transistor GT3-1 may be connected to the input terminal of the $(n-1)^{th}$ carry signal CR(n-1), and the source electrode of the third-first gate transistor GT3-1 may be connected to the drain electrode of the third-second gate transistor GT3-2. The gate electrode of the third-second gate transistor GT3-2 may be connected to the input terminal of the $(n-1)^{th}$ carry signal CR(n-1), the drain electrode of the third-second gate transistor GT3-2 may be connected to the source electrode of the third-first gate transistor GT3-1, and the source electrode of the third-second gate transistor GT3-2 may be connected to the first node N1. The source electrode of the third-first gate transistor GT3-1 and the drain electrode of the third-second gate transistor GT3-2 may be connected to a second node N2, thereby minimizing a leakage current between the third-first gate transistor GT3-1 and the third-second gate transistor GT3-2. Accordingly, the third gate transistor GT3 may control the voltage of the first node N1 based on the $(n-1)^{th}$ carry signal CR(n-1).

The fourth gate transistor GT4 may be turned on based on the fifth input signal S5 to discharge the first node N1. The fourth gate transistor GT4 may be a dual transistor including a fourth-first gate transistor GT4-1 and a fourth-second gate transistor GT4-2. The gate electrode of the fourth-first gate transistor GT4-1 may be connected to the input terminal of the fifth input signal S5, the drain electrode of the fourth-first gate transistor GT4-1 may be connected to the first node N1, and the source electrode of the fourth-first gate transistor GT4-1 may be connected to the drain electrode of the fourth-second gate transistor GT4-2. The gate electrode of the fourth-second gate transistor GT4-2 may be connected to the input terminal of the fifth input signal S5, the drain electrode of the fourth-second gate transistor GT4-2 may be connected to the source electrode of the fourth-first gate transistor GT4-1, and the source electrode of the fourth-second gate transistor GT4-2 may be connected to the input terminal of the second low potential voltage VSS2. The source electrode of the fourth-first gate transistor GT4-1 and the drain electrode of the fourth-second gate transistor GT4-2 may be connected to the second node N2, thereby minimizing a leakage current between the fourth-first gate transistor GT4-1 and the fourth-second gate transistor GT4-2. Accordingly, the fourth gate transistor GT4 may be turned on based on the fifth input signal S5, thereby initializing the first node N1 to the second low potential voltage VSS2.

The fifth gate transistor GT5 may be turned on based on a $(n+1)^{th}$ carry signal CR(n+1) to discharge the first node N1. The fifth gate transistor GT5 may be a dual transistor including a fifth-first gate transistor GT5-1 and a fifth-second gate transistor GT5-2. The gate electrode of the fifth-first gate transistor GT5-1 may be connected to the input terminal of the $(n+1)^{th}$ carry signal CR(n+1), the drain electrode of the fifth-first gate transistor GT5-1 may be connected to the first node N1, and the source electrode of the fifth-first gate transistor GT5-1 may be connected to the drain electrode of the fifth-second gate transistor GT5-2. The gate electrode of the fifth-second gate transistor GT5-2 may be connected to the input terminal of the $(n+1)^{th}$ carry signal CR(n+1), the drain electrode of the fifth-second gate transistor GT5-2 may be connected to the source electrode of the fifth-first gate transistor GT5-1, and the source electrode of the fifth-second gate transistor GT5-2 may be connected to the input terminal of the second low potential voltage VSS2. The source electrode of the fifth-first gate transistor GT5-1 and the drain electrode of the fifth-second gate transistor GT5-2 may be connected to the second node N2, thereby minimizing a leakage current between the fifth-first gate transistor GT5-1 and the fifth-second gate transistor GT5-2. Accordingly, the fifth gate transistor GT5 may be turned on based on the (n+1)$^{th}$ carry signal CR(n+1), thereby initializing the first node N1 to the second low potential voltage VSS2.

The sixth gate transistor GT6 may be turned on based on the voltage of the first node N1 to supply the sixth input signal S6 to the second node N2. The sixth gate transistor GT6 may be a dual transistor including a sixth-first gate transistor GT6-1 and a sixth-second gate transistor GT6-2. The gate electrode of the sixth-first gate transistor GT6-1 may be connected to the first node N1, the drain electrode of the sixth-first gate transistor GT6-1 may be connected to the input terminal of the sixth input signal S6, and the source electrode of the sixth-first gate transistor GT6-1 may be connected to the drain electrode of the sixth-second gate transistor GT6-2. The gate electrode of the sixth-second gate transistor GT6-2 may be connected to the first node N1, the drain electrode of the sixth-second gate transistor GT6-2 may be connected to the source electrode of the sixth-first gate transistor GT6-1, and the source electrode of the sixth-second gate transistor GT6-2 may be connected to the second node N2. Accordingly, the sixth gate transistor GT6 may control the voltage of the second node N2 based on the sixth input signal S6.

The seventh gate transistor GT7 may be turned on based on the carry clock signal CCK to output the voltage of the first node N1 as a carry signal CR(n). The seventh gate transistor GT7 may be a dual transistor including a seventh-first gate transistor GT7-1 and a seventh-second gate transistor GT7-2. The gate electrode of the seventh-first gate transistor GT7-1 may be connected to the input terminal of the carry clock signal CCK, the drain electrode of the seventh-first gate transistor GT7-1 may be connected to the first node N1, and the source electrode of the seventh-first gate transistor GT7-1 may be connected to the drain electrode of the seventh-second gate transistor GT7-2. The gate electrode of the seventh-second gate transistor GT7-2 may be connected to the input terminal of the carry clock signal CCK, the drain electrode of the seventh-second gate transistor GT7-2 may be connected to the source electrode of the seventh-first gate transistor GT7-1, and the source electrode of the seventh-second gate transistor GT7-2 may be connected to the output terminal of the carry signal CR(n). The source electrode of the seventh-first gate transistor GT7-1 and the drain electrode of the seventh-second gate transistor GT7-2 may be connected to the second node N2, thereby minimizing a leakage current between the seventh-first gate transistor GT7-1 and the seventh-second gate transistor GT7-2. Accordingly, the seventh gate transistor GT7 may be turned on based on the carry clock signal CCK, thereby outputting the carry signal CR(n).

The eighth gate transistor GT8 may be turned on based on the voltage of the first node N1 to supply the carry clock signal CCK to the output terminal of the carry signal CR(n). The gate electrode of the eighth gate transistor GT8 may be connected to the first node N1, the drain electrode of the eighth gate transistor GT8 may be connected to the input terminal of the carry clock signal CCK, and the source electrode of the eighth gate transistor GT8 may be connected to the output terminal of the carry signal CR(n). Accordingly, the eighth gate transistor GT8 may be turned on based on the voltage of the first node N1, thereby outputting the carry signal CR(n).

The second gate capacitor GC2 may be connected between the first node N1 and the output terminal of the carry signal CR(n). The second gate capacitor GC2 may be connected between the gate electrode of the eighth gate transistor GT8 and the source electrode of the eighth gate transistor GT8. Accordingly, the second gate capacitor GC2 may maintain a potential difference between the gate electrode and the source electrode of the eighth gate transistor GT8.

The ninth gate transistor GT9 may be turned on based on the second input signal S2 to connect the source electrode of the tenth gate transistor GT10 to the first node N1. The ninth gate transistor GT9 may be a dual transistor including a ninth-first gate transistor GT9-1 and a ninth-second gate transistor GT9-2. The gate electrode of the ninth-first gate transistor GT9-1 may be connected to the input terminal of the second input signal S2, the drain electrode of the ninth-first gate transistor GT9-1 may be connected to the source electrode of the tenth gate transistor GT10, and the source electrode of the ninth-first gate transistor GT9-1 may be connected to the drain electrode of the ninth-second gate transistor GT9-2. The gate electrode of the ninth-second gate transistor GT9-2 may be connected to the input terminal of the second input signal S2, the drain electrode of the ninth-second gate transistor GT9-2 may be connected to the source electrode of the ninth-first gate transistor GT9-1, and the source electrode of the ninth-second gate transistor GT9-2 may be connected to the first node N1. The source electrode of the ninth-first gate transistor GT9-1 and the drain electrode of the ninth-second gate transistor GT9-2 may be connected to the second node N2, thereby minimizing a leakage current between the ninth-first gate transistor GT9-1 and the ninth-second gate transistor GT9-2. Accordingly, the ninth gate transistor GT9 may control the voltage of the first node N1 based on the second input signal S2.

The tenth gate transistor GT10 may be turned on based on the voltage of a third node N3 to supply the sixth input signal S6 to the drain electrode of the ninth-first gate transistor GT9-1. The gate electrode of the tenth gate transistor GT10 may be connected to the third node N3, the drain electrode of the tenth gate transistor GT10 may be connected to the input terminal of the sixth input signal S6, and the source electrode of the tenth gate transistor GT10 may be connected to the drain electrode of the ninth-first gate transistor GT9-1. Accordingly, the tenth gate transistor GT10 may supply the sixth input signal S6 to the ninth gate transistor GT9 based on the voltage of the third node N3.

The third gate capacitor GC3 may be connected between the third node N3 and the input terminal of the sixth input signal S6. The third gate capacitor GC3 may be connected between the drain electrode of the tenth gate transistor GT10 and the gate electrode of the tenth gate transistor GT10. Accordingly, the third gate capacitor GC3 may maintain a potential difference between the drain electrode and the gate electrode of the tenth gate transistor GT10.

The eleventh gate transistor GT11 may be turned on based on the first input signal S1 to supply the carry signal CR(n) to the third node N3. The eleventh gate transistor GT11 may be a dual transistor including an eleventh-first gate transistor GT11-1 and an eleventh-second gate transistor GT11-2. The gate electrode of the eleventh-first gate transistor GT11-1 may be connected to the input terminal of the first input signal S1, the drain electrode of the eleventh-first gate transistor GT11-1 may be connected to the input terminal of the carry signal CR(n), and the source electrode of the eleventh-first gate transistor GT11-1 may be connected to the drain electrode of the eleventh-second gate transistor GT11-2. The gate electrode of the eleventh-second gate transistor GT11-2 may be connected to the input terminal of the first input signal S1, the drain electrode of the eleventh-second gate transistor GT11-2 may be connected to the source electrode of the eleventh-first gate transistor GT11-1, and the source electrode of the eleventh-second gate transistor GT11-2 may be connected to the third node N3. The source electrode of the eleventh-first gate transistor GT11-1 and the drain electrode of the eleventh-second gate transistor GT11-2 may be connected to the source electrode of the twelfth gate transistor GT12, thereby minimizing a leakage current between the eleventh-first gate transistor GT11-1 and the eleventh-second gate transistor GT11-2. Accordingly, the eleventh gate transistor GT11 may control the voltage of the third node N3 based on the first input signal S1.

The twelfth gate transistor GT12 may be turned on based on the voltage of the third node N3 to supply the sixth input signal S6 to the source electrode of the eleventh-first gate transistor GT11-1 or the drain electrode of the eleventh-second gate transistor GT11-2. The gate electrode of the twelfth gate transistor GT12 may be connected to the third node N3, the drain electrode of the twelfth gate transistor GT12 may be connected to the input terminal of the sixth input signal S6, and the source electrode of the twelfth gate transistor GT12 may be connected to the source electrode of the eleventh-first gate transistor GT11-1 and the drain electrode of the eleventh-second gate transistor GT11-2. Accordingly, the twelfth gate transistor GT12 may minimize a leakage current between the eleventh-first gate transistor GT11-1 and the eleventh-second gate transistor GT11-2.

The thirteenth gate transistor GT13 may be turned on based on the fifth input signal S5 to supply the carry signal CR(n) to the input terminal of the second low potential voltage VSS2. The gate electrode of the thirteenth gate transistor GT13 may be connected to the input terminal of the fifth input signal S5, the drain electrode of the thirteenth gate transistor GT13 may be connected to the input terminal of the carry signal CR(n), and the source electrode of the thirteenth gate transistor GT13 may be connected to the input terminal of the second low potential voltage VSS2.

Accordingly, the gate driver GDP may be disposed in the display area DA and may receive the scan clock signal SCK, the scan clock bar signal SCB, the carry clock signal CCK, the first input signal S1, the second input signal S2, the fifth input signal S5, the sixth input signal S6, the first low potential voltage VSS1, and the second low potential voltage VSS2 from the gate input lines GIL. The gate driver GDP may output the gate signal SC(n) and the carry signal CR(n) by including the first to thirteenth gate transistors GT1 to GT13 and the first to third gate capacitors GC1 to GC3.

Figure 8:
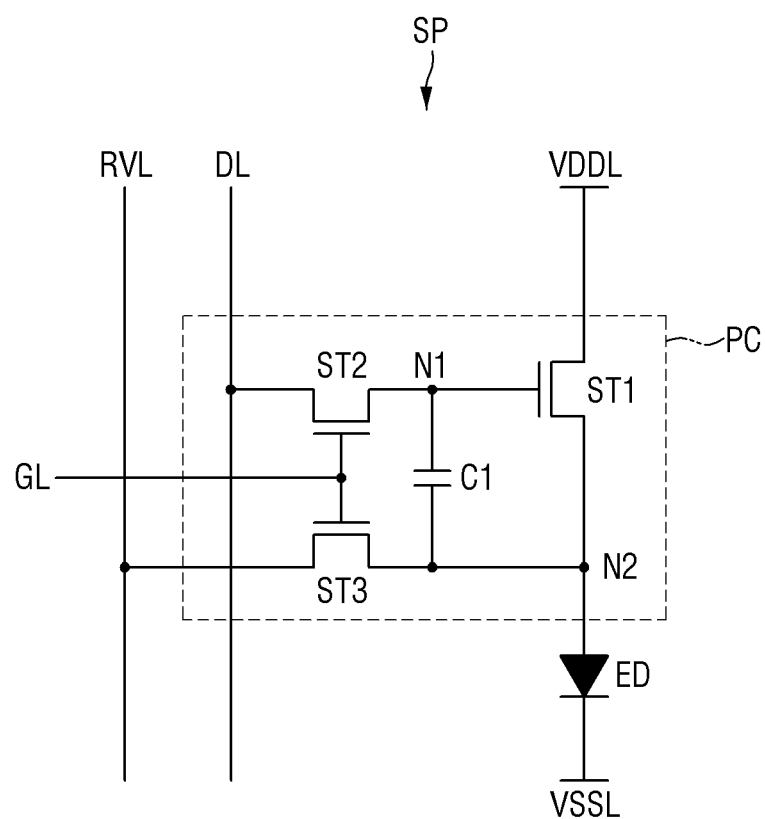
FIG. 8 is a schematic diagram of an equivalent circuit illustrating a pixel of a display device according to an embodiment.

FIG. 8 is a schematic diagram of an equivalent circuit illustrating a pixel of a display device according to an embodiment.

Referring to FIG. 8, each of the pixels SP may be connected to the gate line GL, the driving voltage line VDDL, the data line DL, a reference voltage line RVL, and the low potential line VSSL.

Each of the pixels SP may include a pixel circuit PC and a light emitting element ED. The pixel circuit PC may include first to third transistors ST1, ST2, and ST3 and a first capacitor C1.

The first transistor ST1 may control a driving current supplied to the light emitting element ED. The first transistor ST1 may supply a driving voltage to the light emitting element ED based on the voltage of the first node N1. The gate electrode of the first transistor ST1 may be connected to the first node N1, the drain electrode of the first transistor ST1 may be connected to the driving voltage line VDDL, and the source electrode of the first transistor ST1 may be connected to the second node N2 that is the first electrode of the light emitting element ED. Accordingly, the first transistor ST1 may control the driving current (or the source-drain current) based on the voltage of the first node N1.

The light emitting element ED may emit light by receiving a driving current. The light emission amount or the luminance of the light emitting element ED may be proportional to the magnitude of the driving current. The light emitting element ED may be an inorganic light emitting element including a first electrode, a second electrode, and an inorganic semiconductor disposed between the first electrode and the second electrode, but is not limited thereto. The first electrode of the light emitting element ED may be connected to the second node N2, and the second electrode of the light emitting element ED may be connected to the low potential line VSSL.

The second transistor ST2 may be turned on by the gate signal of the gate line GL to connect the data line DL to the first node N1 which is the gate electrode of the first transistor ST1. The gate electrode of the second transistor ST2 may be connected to the gate line GL, the drain electrode of the second transistor ST2 may be connected to the data line DL, and the source electrode of the second transistor ST2 may be connected to the first node N1. Accordingly, the second transistor ST2 may be turned on based on the gate signal to supply the data voltage to the first node N1.

The third transistor ST3 may be turned on by the gate signal of the gate line GL to connect the reference voltage line RVL to the second node N2 that is the source electrode of the first transistor ST1. The gate electrode of the third transistor ST3 may be connected to the gate line GL, the drain electrode of the third transistor ST3 may be connected to the reference voltage line RVL, and the source electrode of the third transistor ST3 may be connected to the second node N2. Accordingly, the third transistor ST3 may be turned on based on the gate signal to supply the reference voltage to the second node N2.

The first capacitor C1 may be connected between the first node N1 and the second node N2. The first capacitor C1 may be connected between the gate electrode of the first transistor ST1 and the source electrode of the first transistor ST1. Accordingly, the first capacitor C1 may maintain a potential difference between the gate electrode and the source electrode of the first transistor ST1.

Figure 9:
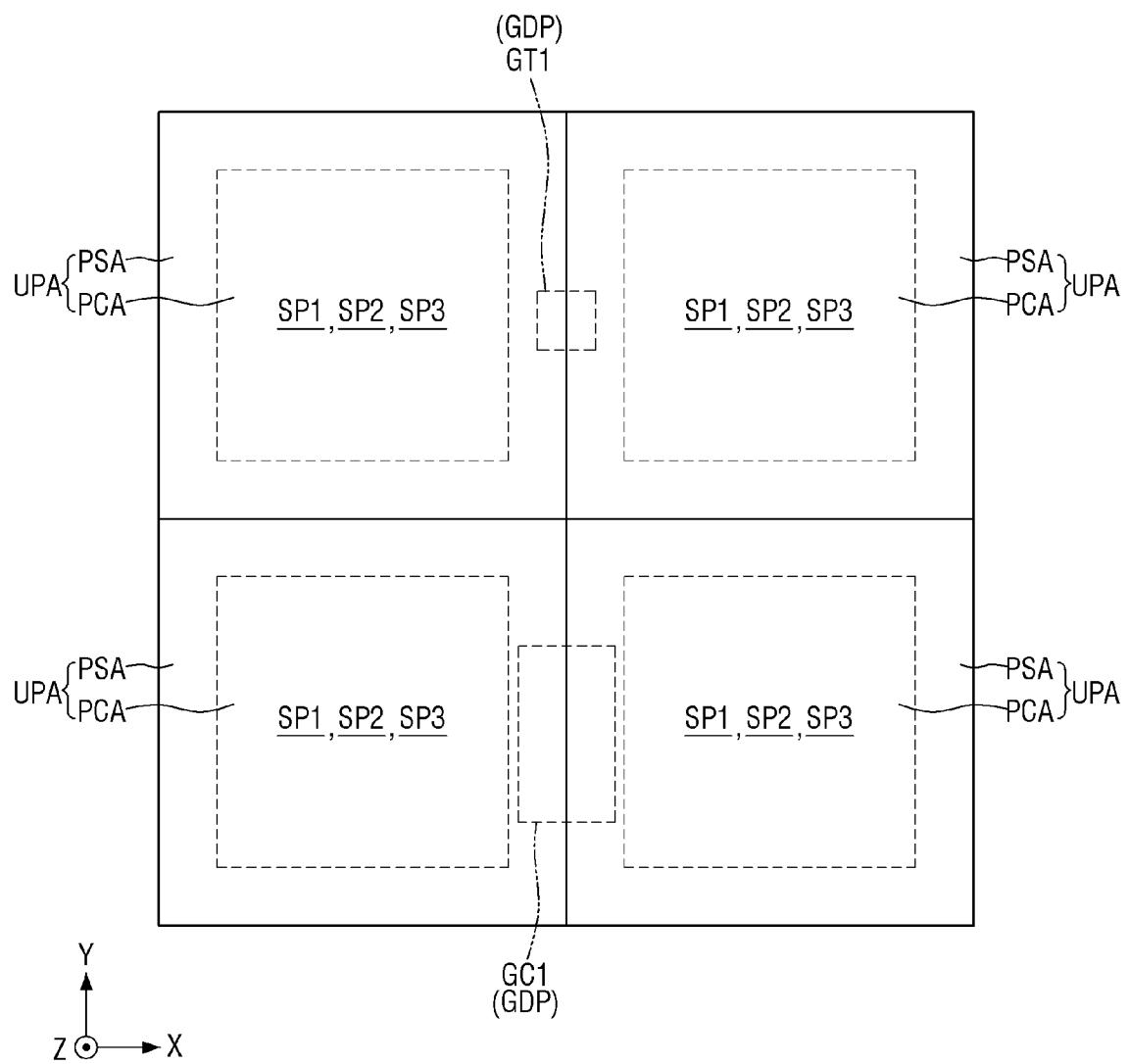
FIG. 9 is a schematic plan view illustrating a unit pixel area of a display device according to an embodiment.

FIG. 9 is a schematic plan view illustrating a unit pixel area of a display device according to an embodiment.

Referring to FIG. 9, the display device 10 may include unit pixels UP arranged or disposed along or in rows and columns in the display area DA. The unit pixels UP may include the first to third pixels SP1, SP2, and SP3, and each of the first to third pixels SP1, SP2, and SP3 may emit light having a peak wavelength. The first pixel SP1 may emit light of a first color, the second pixel SP2 may emit light of a second color, and the third pixel SP3 may emit light of a third color. The first to third pixels SP1, SP2, and SP3 may be sequentially and repeatedly arranged or disposed along or in the first direction (X-axis direction) in the display area DA, but are not limited thereto.

Each of the unit pixels UP may be disposed in the unit pixel area UPA. The unit pixel area UPA may include a pixel circuit area PCA and a pixel peripheral area PSA.

The pixel circuit area PCA may be a central area of the unit pixel area UPA. The proportion of the pixel circuit area PCA in the unit pixel area UPA may be greater than the proportion of the pixel peripheral area PSA in the unit pixel area UPA, but the disclosure is not limited thereto. The pixel circuit PC of each of the first to third pixels SP1, SP2, and SP3 may be disposed in the pixel circuit area PCA. For example, the first to third transistors ST1, ST2, and ST3 and the first capacitor C1 of each of the first to third pixels SP1, SP2, and SP3 may be disposed in the pixel circuit area PCA.

The pixel peripheral area PSA may be disposed on the outer edge of the unit pixel area UPA to surround the pixel circuit area PCA. The gate driver GDP may include gate transistors and gate capacitors, and thus may be disposed across the unit pixel areas UPA in one row. The gate driver GDP may be disposed across several or tens of unit pixel areas UPA depending on its size, but is not limited thereto. The gate driver GDP may be disposed in the pixel peripheral areas PSA of the unit pixel areas UPA. The gate driver GDP may receive a gate input signal from the gate input line GIL disposed in the pixel peripheral area PSA.

For example, the gate driver GDP may include the first to thirteenth gate transistors GT1 to GT13 and the first to third gate capacitors GC1 to GC3. The first gate transistor GT1 may be disposed between the unit pixel areas UPA adjacent in the first direction (X-axis direction), and the first gate capacitor GC1 may be disposed between the unit pixel areas UPA adjacent in the first direction (X-axis direction). The gate driver GDP may be disposed in a region remaining after the pixel circuits PC of the pixels SP are disposed. Accordingly, the gate driver GDP may be disposed on at least one of an upper side, a lower side, a left side, or a right side of the pixel peripheral area PSA according to a design condition of the pixel circuit PC.

Accordingly, the display device 10 may include the gate input line GIL and the gate driver GDP disposed in the display area DA, thereby minimizing the size of the non-display area NDA. The display device 10 may further minimize the size of the non-display area NDA compared to a case where the gate driver is disposed in the non-display area NDA and a case where the gate driver is disposed on a separate flexible film. The tiled display device TD may include the display devices 10 in which the size of the non-display area NDA is minimized, so that the coupling area SM between the display devices 10 may be small enough not to be recognized by the user. In the tiled display device TD, the coupling area SM between the display devices 10 may be prevented from being recognized by the user, thereby reducing a sense of disconnection between the display devices 10 and improving a sense of immersion in an image.

Figure 10:
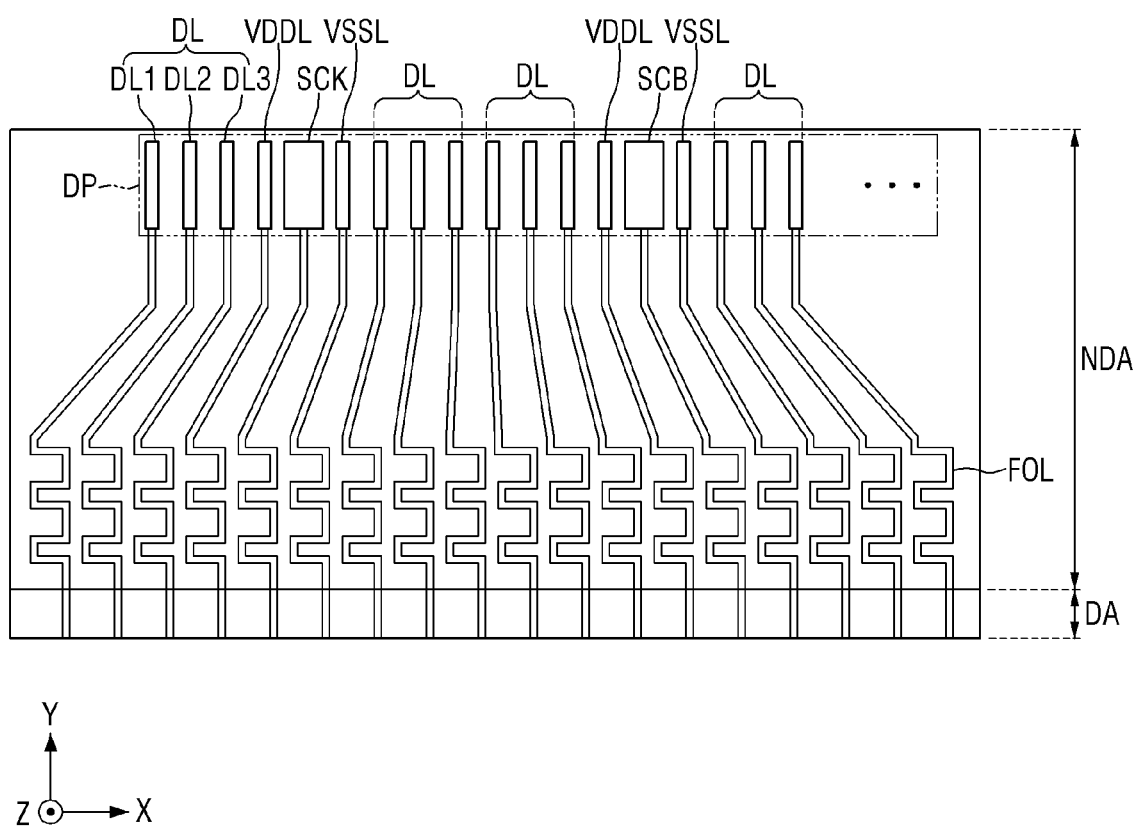
FIG. 10 is a schematic plan view illustrating a pad unit of a display device according to an embodiment.

FIG. 10 is a schematic plan view illustrating a pad unit of a display device according to an embodiment.

Referring to FIG. 10, the flexible film FPCB may be connected to the pad unit DP on the substrate. The fan-out lines FOL may be connected between the pad unit DP and the display area DA. For example, each of the fan-out lines FOL may be connected between the data line DL and the pad unit DP, may be connected between the gate input line GIL and the pad unit DP, and may be connected between the driving voltage line VDDL and the pad unit DP.

The data lines DL may include first to third data lines DL1, DL2, and DL3. The first data line DL1 may supply a data voltage to the first pixel SP1, the second data line DL2 may supply a data voltage to the second pixel SP2, and the third data line DL3 may supply a data voltage to the third pixel SP3. The first to third data lines DL1, DL2, and DL3 corresponding to one unit pixel UP may be disposed adjacent to each other, but are not limited thereto.

The gate input lines GIL may extend in the second direction (Y-axis direction) and may be spaced apart from each other in the first direction (X-axis direction). The gate input lines GIL may be connected between the data driver SIC and the gate driver GDP. The gate input line GIL may supply a gate input signal to the gate drivers GDP. The gate input lines GIL may supply the scan clock signal SCK, the scan clock bar signal SCB, the carry clock signal CCK, the first input signal S1, the second input signal S2, the fifth input signal S5, the sixth input signal S6, the first low potential voltage VSS1, and the second low potential voltage VSS2 to the gate driver GDP.

Each of the gate input lines GIL may be disposed between the driving voltage line VDDL and the low potential line VSSL. For example, the input line of the scan clock signal SCK may be disposed between the driving voltage line VDDL and the low potential line VSSL. The input line of the scan clock bar signal SCB may be disposed between the driving voltage line VDDL and the low potential line VSSL. The driving voltage line VDDL, the gate input line GIL, and the low potential line VSSL may be disposed between the data lines DL. The data line DL, the driving voltage line VDDL, the gate input line GIL, the low potential line VSSL, and the data line DL may be sequentially arranged or disposed in the first direction (X-axis direction) or in a direction opposite to the first direction (X-axis direction). Accordingly, each of the driving voltage line VDDL and the low potential line VSSL may be disposed between the gate input line GIL and the data line DL, thereby canceling signal interference between the gate input line GIL and the data line DL and relieving a coupling capacitance between the gate input line GIL and the data line DL.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the disclosure and the following claims.

What is claimed is:
1. A display device comprising:
a display area including pixels;
a non-display area adjacent to the display area; and
a display driver electrically connected to the non-display area, wherein
the display area comprises:
data lines that supply a data voltage received from the display driver to the pixel, the data line extending in a first direction;
a gate input line electrically connected to the display driver and extending in the first direction;
a gate driver electrically connected to the gate input line; and
a gate line electrically connected to the gate driver and extending in a second direction intersecting the first direction, wherein
the gate driver separately outputs a gate signal and a carry signal (CR(n)),
the gate driver includes:
an output terminal of the gate signal disposed in the display area; and
an output terminal of the carry signal disposed in the display area, and
the gate input line is disposed between the data lines in the non-display area and includes an input signal line that is electrically connected to gate electrode of a transistor of the Bate driver, a drain electrode of the transistor receiving the carry signal.

2. The display device of claim 1, wherein
the display area comprises pixel areas including the pixels, and
at least one of the pixel areas comprises:
a pixel circuit area including a pixel circuit of the pixel; and
a pixel peripheral area including the gate driver, the pixel peripheral area surrounding the pixel circuit area.

3. The display device of claim 2, wherein
the pixel areas are disposed in rows and columns, and
the gate driver is disposed across the pixel peripheral area of the pixel areas in a row.

4. The display device of claim 2, wherein the gate driver comprises:
a first gate transistor that supplies a scan clock signal to the output terminal of the gate signal based on a voltage of a first node;
a second gate transistor that discharges the output terminal of the gate signal based on a scan clock bar signal that is a reverse signal of the scan clock signal; and
a first gate capacitor electrically connected between a gate electrode and a source electrode of the first gate transistor.

5. The display device of claim 4, wherein each of the first gate transistor, the second gate transistor, and the first gate capacitor is disposed on at least one of an upper side, a lower side, a left side, or a right side of the pixel peripheral area.

6. The display device of claim 4, wherein
a source electrode of the second gate transistor receives a first low potential voltage, and
the gate driver further comprises:
a third gate transistor that is turned on based on a carry clock signal to output the voltage of the first node as the carry signal;
a fourth gate transistor that controls the voltage of the first node based on a prior carry signal (CR(n−1));
a fifth gate transistor that initializes the first node to a second low potential voltage based on a subsequent carry signal (CR(n+1)), and
the transistor that transmits the carry signal of the gate driver to an input terminal of the second low potential voltage based on an input signal received from the input signal line.

7. The display device of claim 1, wherein the gate driver comprises:
first gate drivers disposed in a first column;
second gate drivers disposed in a second column;
third gate drivers disposed in a third column; and
fourth gate drivers disposed in a fourth column.

8. The display device of claim 7, wherein the first gate drivers receive a same gate input signal and supply the gate signal to different gate lines.

9. The display device of claim 7, wherein
the first gate drivers disposed in a first row and a fifth row;
the second gate drivers disposed in a second row and a sixth row;
the third gate drivers disposed in a third row and a seventh row; and
the fourth gate drivers disposed in a fourth row and an eighth row.

10. The display device of claim 9, wherein
the gate input line of the first column is electrically connected to the first gate drivers of the first row and the fifth row,
the gate input line of the second column is electrically connected to the second gate drivers of the second row and the sixth row,
the gate input line of the third column is electrically connected to the third gate drivers of the third row and the seventh row, and
the gate input line of the fourth column is electrically connected to the fourth gate drivers of the fourth row and the eighth row.

11. The display device of claim 9, wherein
the first gate drivers are electrically connected to the gate lines of the first row and the fifth row,
the second gate drivers are electrically connected to the gate lines of the second row and the sixth row,
the third gate drivers are electrically connected to the gate lines of the third row and the seventh row, and
the fourth gate drivers are electrically connected to the gate lines of the fourth row and the eighth row.

12. The display device of claim 1, wherein the gate input line comprises:
a scan clock signal input line that inputs a scan clock signal to the gate driver;
a scan clock bar signal input line that inputs a reverse signal of the scan clock signal to the gate driver; and
a carry clock signal input line that inputs a carry clock signal to the gate driver to output the carry signal.

13. The display device of claim 12, wherein each of the scan clock signal input line, the scan clock bar signal input line, and the carry clock signal input line is disposed between the data lines.

14. The display device of claim 12, further comprising:
a driving voltage line that supplies a driving voltage to the pixel, the driving voltage line extending in the first direction; and
a low potential line that supplies a low potential voltage to the pixel, the low potential line extending in the first direction.

15. The display device of claim 14, wherein the non-display area comprises:
a pad part electrically connected to the display driver; and
fan-out lines disposed between the pad part and the display area, and
the fan-out lines include bent portions.

16. The display device of claim 15, wherein each of the fan-out lines has a same length.

17. The display device of claim 15, wherein each of the driving voltage line and the low potential line includes a plate electrode overlapping the fan-out lines in a thickness direction.

18. The display device of claim 14, wherein each of the scan clock signal input line, the scan clock bar signal input line, and the carry clock signal input line is disposed between the driving voltage line and the low potential line.

19. The display device of claim 18, wherein the driving voltage line, the gate input line, and the low potential line are disposed between the data lines.

20. A tiled display device comprising:
display devices, each including:
a display area including pixels;
a non-display area adjacent to the display area; and
a display driver electrically connected to the non-display area, wherein the display area of each of the display devices comprises:
- data lines that supplies a data voltage received from the display driver to the pixels, the data line extending in a first direction;
- a gate input line electrically connected to the display driver and extending in the first direction;
- a gate driver electrically connected to the gate input line; and
- a gate line electrically connected to the gate driver and extending in a second direction intersecting the first direction, wherein the gate driver separately outputs a gate signal and a carry signal (CR(n)), the gate driver includes:
- an output terminal of the gate signal disposed in the display area; and
- an output terminal of the carry signal disposed in the display area, and the gate input line is disposed between the data lines in the non-display area and includes an input signal line that is electrically connected to a gate electrode of a transistor of the gate driver, a drain electrode of the transistor receiving the carry signal.

21. The tiled display device of claim 20, further comprising:
- a coupling area disposed between the display devices,
- wherein the display driver is disposed on a side of the non-display area adjacent to the coupling area, or in the non-display area disposed on an opposite side of the coupling area with respect to the display area.

22. The tiled display device of claim 20, wherein the display area comprises pixel areas including the pixels, and
at least one of the pixel areas comprises:
- a pixel circuit area including a pixel circuit of the pixel; and
- a pixel peripheral area including the gate driver, the pixel peripheral area surrounding the pixel circuit area.

23. The tiled display device of claim 22, wherein
the pixel areas are disposed in rows and columns, and
the gate driver is disposed across the pixel peripheral areas of the pixel areas in one row.

24. The tiled display device of claim 22, wherein
the gate driver comprises:
- a first gate transistor that supplies a scan clock signal to the output terminal of the gate signal based on a voltage of a first node;
- a second gate transistor that discharges the output terminal of the gate signal based on a scan clock bar signal that is a reverse signal of the scan clock signal; and
- a first gate capacitor electrically connected between a gate electrode and a source electrode of the first gate transistor, each of the first gate transistor, the second gate transistor, and the first gate capacitor is disposed on at least one of an upper side, a lower side, a left side, or a right side of the pixel peripheral area.

* * * * *